(12) United States Patent
Liu

(10) Patent No.: US 12,063,845 B2
(45) Date of Patent: Aug. 13, 2024

(54) DISPLAY DEVICE, DISPLAY PANEL AND METHOD OF MANUFACTURING DISPLAY PANEL

(71) Applicant: BOE TECHNOLOGY GROUP CO., LTD., Beijing (CN)

(72) Inventor: Ming Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 461 days.

(21) Appl. No.: 17/358,327

(22) Filed: Jun. 25, 2021

(65) Prior Publication Data

US 2022/0165796 A1    May 26, 2022

(30) Foreign Application Priority Data

Nov. 23, 2020 (CN) .......................... 202011318530.2

(51) Int. Cl.
*H10K 65/00* (2023.01)
*H10K 59/124* (2023.01)
*H10K 59/12* (2023.01)

(52) U.S. Cl.
CPC ........... *H10K 65/00* (2023.02); *H10K 59/124* (2023.02); *H10K 59/1201* (2023.02)

(58) Field of Classification Search
None
See application file for complete search history.

(56) References Cited

U.S. PATENT DOCUMENTS

| 9,082,676 | B2* | 7/2015 | Kurokawa | G01S 7/4865 |
| 11,031,448 | B2* | 6/2021 | Zhou | H10K 71/00 |
| 11,657,640 | B2* | 5/2023 | Lu | H10K 59/65 |
| | | | | 382/124 |
| 2018/0019288 | A1* | 1/2018 | Yang | H01L 27/1255 |
| 2021/0397806 | A1* | 12/2021 | Lu | H10K 50/865 |

FOREIGN PATENT DOCUMENTS

| CN | 107066162 A | * | 8/2017 | ........... G06F 3/0412 |
| CN | 107425038 A | * | 12/2017 | ......... G06K 9/00006 |
| CN | 108831912 A | * | 11/2018 | ........... G09G 3/3233 |

(Continued)

*Primary Examiner* — Telly D Green
(74) *Attorney, Agent, or Firm* — Calfee, Halter & Griswold LLP

(57) ABSTRACT

The present disclosure relates to a display device, a display panel and a method of manufacturing the same, and relates to display technology. The display panel of the present disclosure includes a driving backplane, a first planarization layer, a second planarization layer, light-emitting devices and photoelectric sensing devices. The first planarization layer is provided on one side of the driving backplane. The second planarization layer is provided on a surface of the first planarization layer distal to the driving backplane, and the second planarization layer is provided with sensing holes. The light-emitting devices are provided on a surface of the second planarization layer distal to the driving backplane and are located outside the sensing holes. The photoelectric sensing devices are provided on a surface of the second planarization layer distal to the driving backplane, and each of the photoelectric sensing devices is at least partially located inside the sensing hole.

14 Claims, 5 Drawing Sheets

(56) References Cited

FOREIGN PATENT DOCUMENTS

| | | | | |
|---|---|---|---|---|
| CN | 109034089 A | * | 12/2018 | ......... G06K 9/00046 |
| CN | 109037296 A | * | 12/2018 | ........... G06K 9/0004 |
| CN | 111312792 A | * | 6/2020 | ........... G06F 3/0443 |
| WO | WO-2016208414 A1 | * | 12/2016 | |
| WO | WO-2018129970 A1 | * | 7/2018 | ............. G06F 3/041 |

* cited by examiner

DISPLAY DEVICE, DISPLAY PANEL AND METHOD OF MANUFACTURING DISPLAY PANEL

CROSS-REFERENCE TO RELATED APPLICATIONS

This application is based on and claims priority to Chinese Patent Application No. 202011318530.2, filed on Nov. 23, 2020, the entire contents thereof are incorporated herein by reference.

TECHNICAL FIELD

The present disclosure relates to display technologies, and more particularly, to a display device, a display panel and a method of manufacturing the display panel.

BACKGROUND

At present, display panels have been widely used in various electronic devices. The display panels that adopt Organic Photodiodes Diode (OPD) technologies to realize fingerprint recognition have a wider application prospect because of their strong integration.

It should be noted that information disclosed in the Background Art are provided only for acquiring a better understanding of the background of the present application and therefore may include information that is not current technology already known to those of ordinary skill in the art.

SUMMARY

It is an object of the present disclosure to at least partially overcome the aforementioned deficiencies of the current technology, and to provide a display device, a display panel and a method of manufacturing the display panel, which can improve the accuracy of fingerprint identification.

According to an aspect of the present disclosure, there is provided a display panel, including:
 a driving backplane;
 a first planarization layer, disposed on one side of the driving backplane;
 a second planarization layer, disposed on a surface of the first planarization layer distal to the driving backplane, wherein the second planarization layer is provided with sensing holes;
 light-emitting devices, disposed on a surface of the second planarization layer distal to the driving backplane, and located outside the sensing holes; and
 photoelectric sensing devices, disposed on the surface of the second planarization layer distal to the driving backplane, wherein each of the photoelectric sensing devices is at least partially located within the sensing hole.

In an exemplary embodiment of the present disclosure, the light-emitting device includes:
 a first electrode, disposed on the surface of the second planarization layer distal to the driving backplane;
 a light-emitting functional layer, disposed on a surface of the first electrode distal to the driving backplane; and
 a second electrode, disposed on a surface of the light-emitting functional layer distal to the driving backplane, and
 the photoelectric sensing device includes:
 a first sensing electrode, disposed on the surface of the second planarization layer distal to the driving backplane, and recessed into the sensing hole;
 a photoelectric conversion layer, disposed on a surface of the first sensing electrode distal to the driving backplane, and at least partially located within the sensing hole; and
 a second sensing electrode, disposed on a surface of the photoelectric conversion layer distal to the driving backplane.

In an exemplary embodiment of the present disclosure, side walls of the sensing hole are contracted along a direction towards the driving backplane.

In an exemplary embodiment of the present disclosure, a slope of the side wall of the sensing hole relative to the surface of the first planarization layer distal to the driving backplane is not greater than 50°.

In an exemplary embodiment of the present disclosure, the first sensing electrode includes a central portion and an edge portion surrounding the central portion, wherein the central portion is attached to fit within the sensing hole, and the edge portion is located on the surface of the second planarization layer distal to the driving backplane and is connected to the central portion.

In an exemplary embodiment of the present disclosure, the display panel further includes:
 a pixel definition layer, disposed on the surface of the second planarization layer distal to the driving backplane and having a first opening and a second opening, wherein the first opening exposes the first electrode, and the second opening exposes the first sensing electrode,
 wherein the second electrode and the second sensing electrode are different regions of a same electrode layer, and the electrode layer covers the pixel definition layer, the light-emitting functional layer and the photoelectric conversion layer.

In an exemplary embodiment of the present disclosure, a boundary of an orthographic projection of the second opening on the second planarization layer coincides with a boundary of the central portion.

In an exemplary embodiment of the present disclosure, the driving backplane has a plurality of pixel regions distributed in an array, and at least three of the light-emitting devices of different colors and at least one of the photoelectric sensing devices are provided within a range of each of the pixel regions.

In an exemplary embodiment of the present disclosure, the light-emitting functional layer has a thickness of 100 nm-200 nm, the photoelectric conversion layer has a thickness of 1 μm-2 μm, and the sensing hole has a depth of 0.7 μm-1.3 μm.

According to an aspect of the present disclosure, there is provided a method of manufacturing the display panel, including:
 forming the driving backplane;
 forming the first planarization layer on the one side of the driving backplane;
 forming the second planarization layer on the surface of the first planarization layer distal to the driving backplane, wherein the second planarization layer is provided with the sensing holes recessed in a direction towards the driving backplane; and
 forming the light-emitting devices and the photoelectric sensing devices on the surface of the second planarization layer distal to the driving backplane, wherein the light-emitting devices are located outside the sensing hole, and each of the photoelectric sensing devices is at least partially located within the sensing hole.

In an exemplary embodiment of the present disclosure, forming the light-emitting devices and the photoelectric sensing devices on the surface of the second planarization layer distal to the driving backplane, includes:

forming the first electrode of the light-emitting device and the first sensing electrode of the photoelectric sensing device on the surface of the second planarization layer distal to the driving backplane by single patterning, wherein the first sensing electrode is recessed into the sensing hole;

forming the light-emitting functional layer of the light-emitting device on the surface of the first electrode distal to the driving backplane;

forming the photoelectric conversion layer of the photoelectric sensing device on the surface of the first sensing electrode distal to the driving backplane, wherein the photoelectric conversion layer is at least partially located within the sensing hole; and forming the second electrode of the light-emitting device and the second sensing electrode of the photoelectric sensing device by single patterning, wherein the second electrode is disposed on the surface of the light-emitting functional layer distal to the driving backplane, and the second sensing electrode is disposed on the surface of the photoelectric conversion layer distal to the driving backplane.

According to an aspect of the present disclosure, there is provided a display device including a display panel as described in any one of the above.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the invention and, together with the description, serve to explain the principles of the invention. Obviously, the drawings in the following description are only some embodiments of the present disclosure, and those skilled in the art can also obtain other drawings based on these drawings without any creative work. In the drawings.

Figure 1:
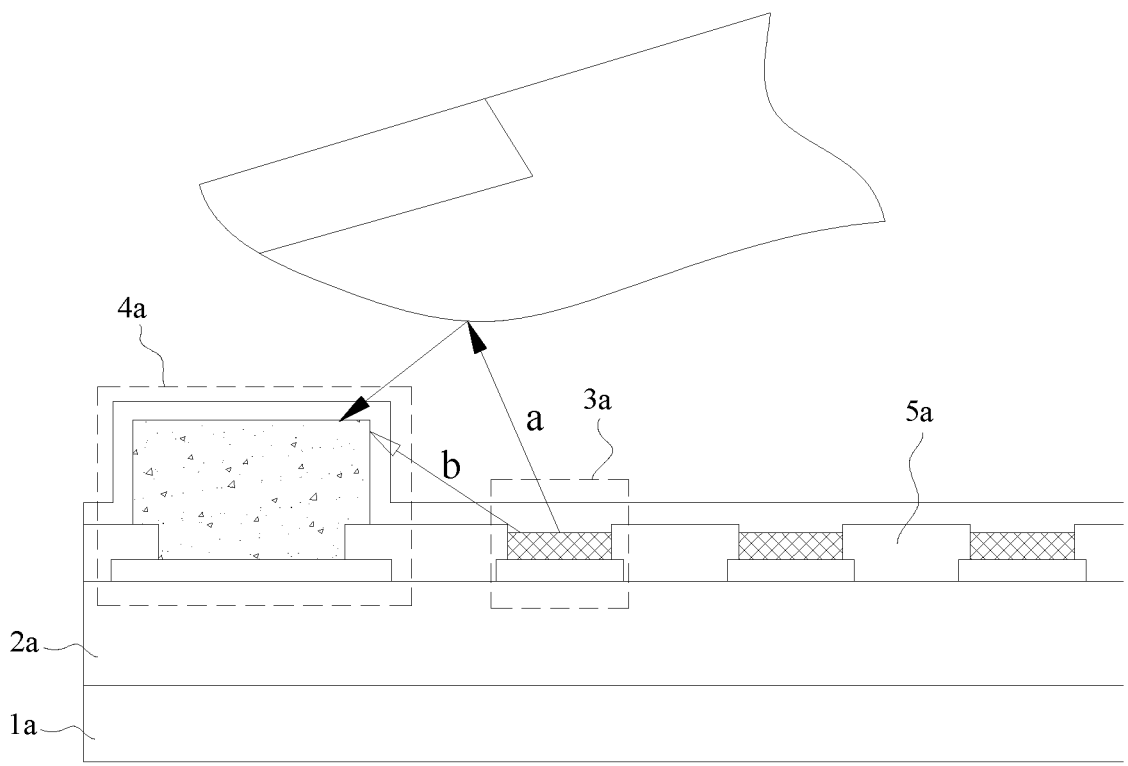
FIG. 1 is a schematic view of a display panel in the related technology.

The description of reference signs:

In FIG. 1: 1a—driving backplane; 2a—planarization layer; 3a—light-emitting device; 4a—photoelectric sensing device; 5a—pixel definition layer.

Figure 2:
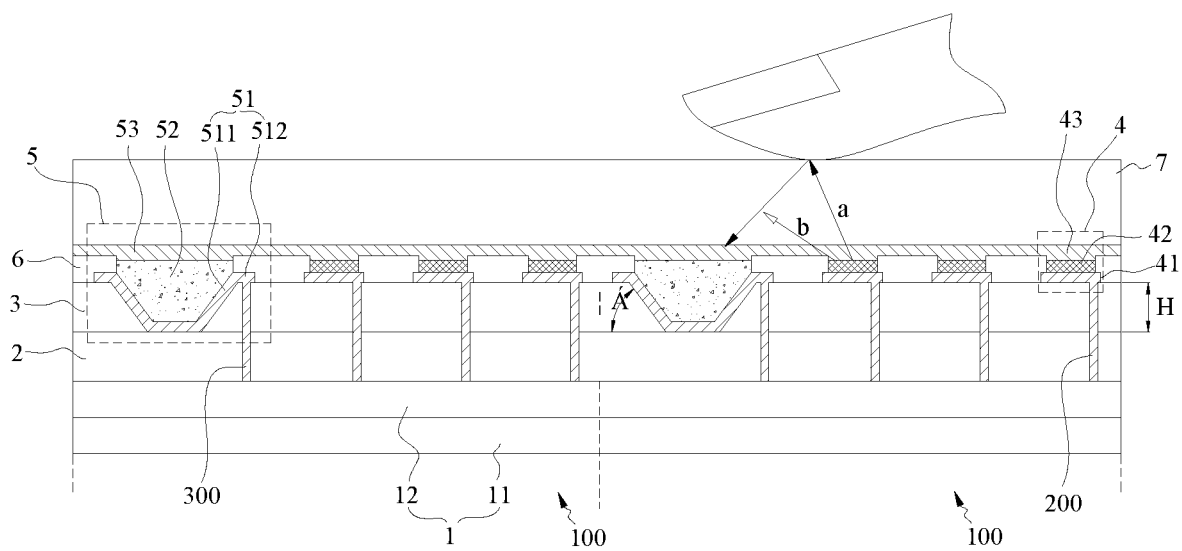
FIG. 2 is a schematic diagram of an embodiment of a display panel of the present disclosure.
Figure 3:
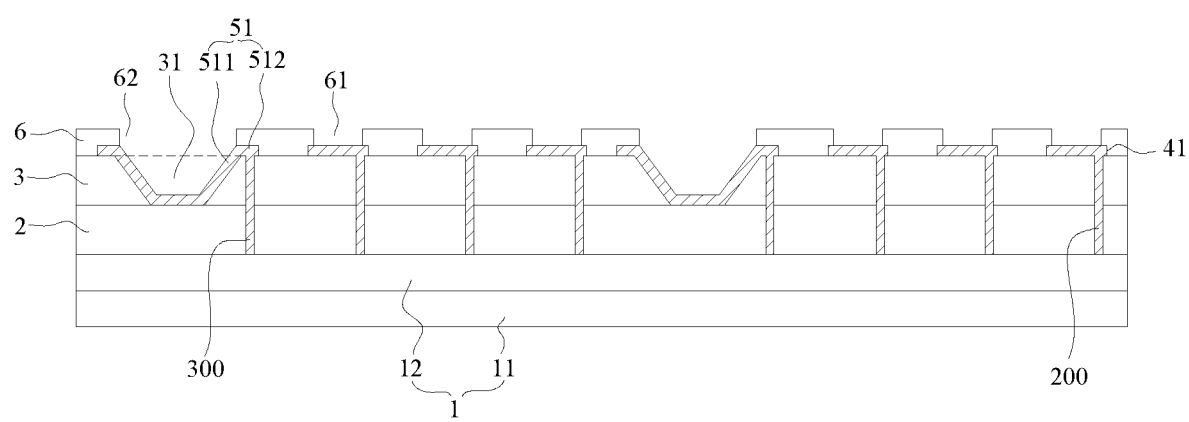
FIG. 3 is a schematic view of sensing holes, first openings and second openings in an embodiment of a display panel of the present disclosure.
Figure 4:
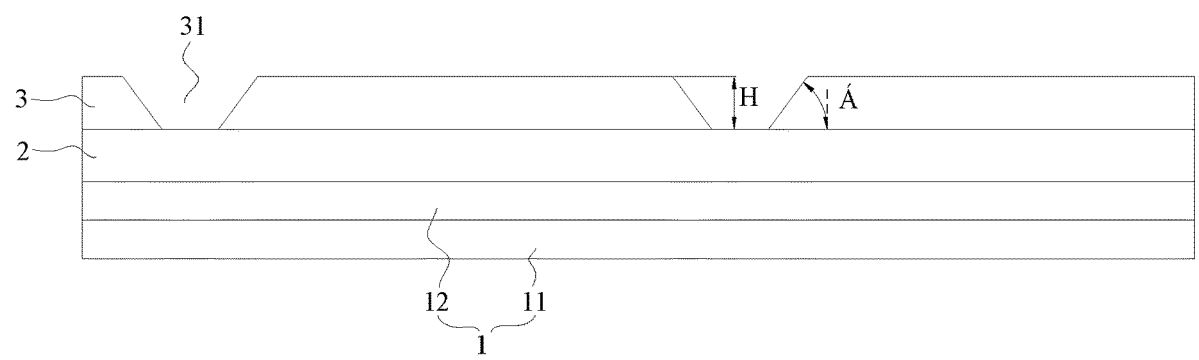
FIG. 4 is a schematic diagram of the sensing hole in an embodiment of a display panel of the present disclosure.

In FIGS. 2-4: 1—driving backplane; 11—substrate; 12—driving layer; 100—pixel region; 2—first planarization layer; 3—second planarization layer; 31—sensing hole; 4—light-emitting device; 41—first electrode; 42—light-emitting functional layer; 43—second electrode; 5—photoelectric sensing device; 51—first sensing electrode; 511—central portion; 512—edge portion; 52—photoelectric conversion layer; 53—second sensing electrode; 6—pixel definition layer; 61—first opening; 62—second opening; 7—encapsulation layer; 200—first via-hole; 300—second via-hole.

DETAILED DESCRIPTION

The exemplary embodiments will now be described more fully with reference to the accompanying drawings. However, the exemplary embodiments can be implemented in various forms and should not be understood as being limited to the examples set forth herein; rather, these embodiments are provided so that this disclosure will be thorough and complete, and the conception of exemplary embodiments will be fully conveyed to those skilled in the art. The same reference numerals in the drawings refer to same or similar parts, and the detailed descriptions thereof will be omitted. Furthermore, the accompanying drawings are only schematic illustrations of the present disclosure and are not necessarily drawn to scale.

Words such as "one", "an/a", "the", "said" and "at least one" are used herein to indicate the presence of one or more elements/component parts/and others. Terms "including", and "having" have an inclusive meaning which means that there may be additional elements/component parts/and others in addition to the listed elements/component parts/and others. Terms "first" and "second" are used herein only as markers, and they do not limit the number of objects modified after them.

In the related technology, as shown in FIG. 1, a display panel for fingerprint recognition by adopting OPD technology may include a driving backplane 1a, a planarization layer 2a, light-emitting devices 3a, photoelectric sensing devices 4a and a pixel definition layer 5a.

The planarization layer 2a is provided on one side of the driving backplane 1a. The light-emitting devices 3a, the photoelectric sensing devices 4a and the pixel definition layer 5a are provided on a surface of the planarization layer 2a distal to the driving backplane 1a, and the pixel definition layer 5a is configured to define the range of the light-emitting devices 3a and the photoelectric sensing devices 4a. The light-emitting devices 3a may be OLED (Organic Light-Emitting Diode) light-emitting devices, and the photoelectric sensing devices 4a may be OPD photoelectric sensing devices. Images may be displayed by the light-emitting of the light-emitting devices 3a. Furthermore, for fingerprint information, upon touching the display panel with a finger, light (e.g. light a in FIG. 1) emitted from the light-emitting device 3a is reflected by valley and ridge stripes of fingerprints and is received by the photoelectric sensing device 4a, which converts an optical signal into an electrical signal in order to obtain fingerprint information, thus realizing the fingerprint recognition.

However, the photoelectric sensing device 4a usually has a larger thickness, and in the case where the photoelectric sensing device 4a and the light-emitting device 3a are disposed on the same plane (the surface of the planarization layer 2a distal to the driving backplane 1a), at least a portion of a region of the photoelectric sensing device 4a is located within a light-emitting range of the light-emitting device 3a, so that a portion of the light (e.g. light b in the figure) emitted from the light-emitting device 3a is directly irradiated onto the photoelectric sensing device 4a instead of being reflected by the finger, thereby forming stray light that affects the accuracy of fingerprint recognition, resulting in a reduced signal-to-noise ratio and reduced accuracy in the process of fingerprint recognition. If the pixel definition layer 5a is made of a transparent or translucent material, the light emitted from the light-emitting device 3a may directly reach the photoelectric sensing device 4a by passing through the adjacent pixel definition layer 5a, thus further increasing stray light and reducing the accuracy of fingerprint recognition, i.e., the accuracy of fingerprint recognition still needs to be improved.

An embodiment of the present disclosure provides a display panel, which may be an OLED display panel. As shown in FIGS. 2-4, the display panel includes a driving backplane 1, a first planarization layer 2, a second planarization layer 3, light-emitting devices 4 and photoelectric sensing devices 5.

The first planarization layer 2 is disposed on one side of the driving backplane 1. The second planarization layer 3 is disposed on a surface of the first planarization layer 2 distal to the driving backplane 1. The second planarization layer 3 is provided with sensing holes 31.

The light-emitting devices 4 are disposed on a surface of the second planarization layer 3 distal to the driving backplane 1, and are located outside the sensing holes 31.

The photoelectric sensing devices 5 are disposed on the surface of the second planarization layer 3 distal to the driving backplane 1, and at least a portion of a region of the photoelectric sensing device 5 is located within the sensing hole 31.

The display panel in the embodiment of the present disclosure may emit light by the light-emitting devices 4 to display the images; moreover, light emitted from the light-emitting device 4 (e.g. light a) may be reflected by a finger and sensed by the photoelectric sensing device 5 to achieve fingerprint recognition. Since the light-emitting device 4 is disposed on the surface of the second planarization layer 3 distal to the driving backplane 1, and at least a portion of the region of the photoelectric sensing device 5 is located within the sensing hole 31, a height of the photoelectric sensing device 5 protruding from the second planarization layer 3 may be reduced or even eliminated, to reduce or eliminate a height of the photoelectric sensing device 5 over the light-emitting device 4, avoiding positioning the photoelectric sensing device 5 within the light-emitting range of the light-emitting device 4, and preventing the light (e.g. light b) emitted from the light-emitting device 4 from being directly irradiated onto the photoelectric sensing device 5 without being reflected by the finger, thereby increasing the signal-to-noise ratio during fingerprint recognition and improving the accuracy of fingerprint recognition.

Hereinafter, various parts of the display panel of the present disclosure will be described in detail.

The driving backplane 1 is configured to support the light-emitting devices 4 and the photoelectric sensing devices 5, can drive the light-emitting devices 4 to emit light, and can receive and process electrical signals generated by the photoelectric sensing devices 5. Specifically, the driving backplane 1 has a display region and a peripheral region surrounding the display region, wherein pixel driving circuits and photoelectric sensing circuits are provided in the display region, the pixel driving circuit is connected to the light-emitting device 4 for driving the light-emitting devices 4 to emit light, and the photoelectric sensing circuit is connected to the photoelectric sensing devices 5 for transmitting and processing the electrical signals generated by the photoelectric sensing devices 5.

A pixel circuit may be a pixel circuit of 6T1C, 7T1C, 7T2C, etc., the specific structure of which is not particularly limited here. Furthermore, the specific structure of the photoelectric sensing circuit is not particularly limited, as long as it realizes the function of transmitting and processing the electrical signals after photoelectric conversion.

A peripheral circuit may be provided in the peripheral region. The peripheral circuit may include a gate electrode driving circuit and a light-emitting control circuit, configured to transmit a drive signal to the pixel driving circuit. Moreover, the peripheral circuit further includes a sensing and processing circuit configured to receive and process the electrical signals output from the photoelectric sensing circuit to enable fingerprint recognition. Other circuits may be provided in the peripheral region as well, which is not particularly limited herein.

As shown in FIG. 2, in some embodiments of the present disclosure, the driving backplane 1 may include a substrate 11 and a driving layer 12 disposed on the substrate 11. The driving layer 12 may have a pixel circuit and a photoelectric sensing circuit. The specific formation of the pixel circuit and the photoelectric sensing circuit are not particularly limited herein.

The number of the pixel circuits is the same as that of the light-emitting devices 4, each of the light-emitting devices 4 is connected to one of the pixel circuits. Similarly, the number of the photoelectric sensing circuits is the same as that of the photoelectric sensing devices 5, each of the photoelectric sensing devices 5 is connected to one of the photoelectric sensing circuit.

The first planarization layer 2 may cover one side of the driving backplane 1, the surface of the first planarization layer 2 distal to the driving backplane 1 is a plane, and the driving layer 12 is located within an orthographic projection of the first planarization layer 2 on the substrate 11.

The second planarization layer 3 may be provided on one side of the first planarization layer 2, edges of the second planarization layer 3 are flush with those of the first planarization layer 2, and the surface of the second planarization layer 3 distal to the driving backplane 1 is a plane.

The material of both the first planarization layer 2 and the second planarization layer 3 is a transparent insulating material, which may be an organic material such as photoresist, or an inorganic material, which is not particularly limited here.

Furthermore, both the first planarization layer 2 and the second planarization layer 3 may be a single-layer structure, or a multi-layer structure, and the material of each layer is not limited to the same material.

In order to accommodate the photoelectric sensing devices 5, the second planarization layer 3 is provided with the sensing holes 31, the sensing holes 31 extend from the surface of the second planarization layer 3 distal to the driving backplane 1 towards the driving backplane 1. Its shape, i.e., the shape of an orthographic projection of the sensing hole 31 on the driving backplane 1, may be a circular shape, a rectangular shape or in other shapes, which is not particularly limited here. Moreover, the sensing hole 31 may have a depth substantially equal to the thickness of the second planarization layer 3, such that the sensing hole 31 exposes the surface of the first planarization layer 2 distal to the driving backplane 1. The depth of the sensing hole 31 may be smaller than the thickness of the second planarization layer 3. In addition, the depth of the sensing hole 31 may be greater than the thickness of the second planarization layer 3, i.e., the sensing hole 31 may be also extending into the first planarization layer 2.

The light-emitting devices 4 may be provided on the surface of the second planarization layer 3 distal to the driving backplane 1, there may be a plurality of the light-emitting devices 4, and the light-emitting devices 4 are distributed in an array. The respective light-emitting devices 4 may be driven by the respective pixel circuits of the driving backplane 1 to emit light separately, thereby displaying an image. Each of the light-emitting devices 4 and its corresponding pixel circuit may form a sub-pixel, and a plurality of sub-pixels with different light-emitting colors may form a pixel. The display panel may include a plurality of pixels distributed in an array.

As shown in FIG. 2, for example, the light-emitting device 4 is an OLED light-emitting device, and any of the light-emitting devices 4 may include a first electrode 41, a light-emitting functional layer 42 and a second electrode 43.

The first electrode 41 is disposed on the surface of the second planarization layer 3 distal to the driving backplane 1, and it may serve as an anode of the OLED light-emitting device and is connected to the corresponding pixel circuit through a first via-hole 200 penetrating the first planarization layer 2 and the second planarization layer 3. For the plurality of light-emitting devices 4, the respective first electrodes 41 are spaced apart from one another and are distributed in an array.

The light-emitting functional layer 42 is provided on a surface of the first electrode 41 distal to the driving backplane 1. Exemplarily, the light-emitting functional layer 42 may include a hole-injection layer, a hole-transport layer, an organic light-emitting material layer, an electron-transport layer and an electron-injection layer laminated sequentially in a direction distal to the driving backplane 1. The light-emitting devices 4 may be enabled to emit light in different colors by fabricating the light-emitting functional layers 42 with different materials. The respective light-emitting devices 4 may use the light-emitting functional layers 42 of the same material to simplify the processes, and a color film may be disposed to achieve light-emission of different colors on one side of the light-emitting device 4 distal to the driving backplane 1.

The second electrode 43 is provided on a surface of the light-emitting functional layer 42 distal to the driving backplane 1, and it may be used as a cathode of the OLED light-emitting device. The light-emitting functional layer 42, i.e., the light-emitting device 4, may be driven to emit light by applying an electrical signal to the first electrode 41 and the second electrode 43. The plurality of light-emitting devices 4 may share the second electrode 43, that is, the second electrode 43 may cover the respective light-emitting functional layers 42 at the same time.

As shown in FIG. 2, the photoelectric sensing devices 5 may be used for photoelectric conversion, and may generate a corresponding electrical signal upon receiving light reflected from the finger, in order for fingerprint recognition. The photoelectric sensing devices 5 are provided on the surface of the second planarization layer 3 distal to the driving backplane 1, there may be a plurality of photoelectric sensing devices 5, the photoelectric sensing devices 5 may be distributed in an array, and the specific number thereof is not particularly defined here, thereby light reflected by the finger may be sensed by the plurality of photoelectric sensing devices 5.

In some embodiments of the present disclosure, the photoelectric sensing device 5 may be an OPD photoelectric sensing device, which may include a first sensing electrode 51, a photoelectric conversion layer 52 and a second sensing electrode 53.

The first sensing electrode 51 is provided on the surface of the second planarization layer 3 distal to the driving backplane 1, and corresponds to the sensing hole 31, that is, an edge of the sensing hole 31 is located within a range covered by the first sensing electrode 51. Moreover, a region of the first sensing electrode 51 corresponding to the sensing hole 31 is attached on the second planarization layer 3 along with the shape of the second planarization layer 3, that is, the first sensing electrode 51 is recessed in a direction towards the driving backplane 1 at the sensing hole 31, thereby covering an inner surface of the sensing hole 31.

The first sensing electrode 51 is connected to the corresponding photoelectric sensing circuit via a second via-hole 300 penetrating the first planarization layer 2 and the second planarization layer 3. The respective first sensing electrodes 51 of the plurality of photoelectric sensing devices 5 are spaced apart from one another and distributed in an array.

The first sensing electrode 51 and the first electrode 41 are provided in the same layer, are made of the same material, may be located in different regions of the same electrode layer, and thus are formed simultaneously by single patterning in order to simplify the processes.

A part of the first sensing electrode 51 is located inside the sensing hole 31, and another part of the first sensing electrode 51 is located outside the sensing hole 31. As shown in FIG. 2, for example, in some embodiments of the present disclosure, the first sensing electrode 51 includes a central portion 511 and an edge portion 512 surrounding the central portion 511.

The central portion 511 is attached to fit within the sensing hole 31, and is a region where the first sensing electrode 51 is recessed into the sensing hole 31.

The edge portion 512 is an annular structure surrounding outside the central portion 511, and the edge portion 512 is located on the surface of the second planarization layer 3 distal to the driving backplane 1 and is connected to an edge of the central portion 511. The central portion 511 and the edge portion 512 may be an integral structure. The first sensing electrode 51 may be connected to the second via-hole 300 through the edge portion 512, to avoid reducing the area where light can be received, due to the presence of the second via-hole 300.

The photoelectric conversion layer 52 may be provided on the surface of the first sensing electrode 51 distal to the driving backplane 1, is made of material different from that of the light-emitting functional layer 42, and is at least partially located within the sensing hole 31. That is, the photoelectric conversion layer 52 may be filled in the recessed region of the first sensing electrode 51, thus it is located within the sensing hole 31 and contacts with the first sensing electrode 51. In other words, the photoelectric conversion layer 52 may be entirely located within the sensing hole 31, or may be partially protruding out of the surface of the second planarization layer 3 distal to the driving backplane 1, as long as its area located within the light-emitting range of the light-emitting device 4 can be reduced. Exemplarily, the photoelectric conversion layer 52 may include a hole-injection layer, a hole-transport layer, an active layer, an electron-transport layer and an electron-injection layer sequentially laminated in the direction distal to the driving backplane 1, and the material of the layers of the photoelectric conversion layer 52 is not particularly limited here.

The second sensing electrode 53 is provided on a surface of the photoelectric conversion layer 52 distal to the driving backplane 1, for example, a surface of the electron-injection layer distal to the driving backplane 1. An electrical signal generated by the photoelectric conversion layer 52 due to illumination may be sensed by the first sensing electrode 51 and the second sensing electrode 53, wherein the first sensing electrode 51 may transmit a signal to the peripheral circuit via the sensing circuit in the driving backplane 1, and the second sensing electrode 53 may transmit a signal to the peripheral circuit, to determine fingerprint information. The second sensing electrode 53 may be a transparent conductive material, for example Indium Tin Oxide (ITO), etc.

The second sensing electrode 53 and the second electrode 43 are disposed in the same layer, and made of the same material, such that they may be located in different regions of the same electrode layer, and the electrode layer is a whole layer structure extending continuously in the direction parallel to the driving backplane 1, and covers both the light-emitting functional layer 42 and the photoelectric conversion layer 52, so that the second sensing electrode 53 and the second electrode 43 may be formed simultaneously by single patterning in order to simplify the processes.

It should be noted that in some embodiments of the present disclosure, if the light-emitting device 4 is a top-emitting structure, the first electrode 41 is a light reflecting structure and the second electrode 43 is a transparent or translucent structure, then, in order to ensure that the photoelectric sensing device 5 can receive the light emitted by the light-emitting device 4 and is reflected by the finger, the first sensing electrode 51 is a light reflecting structure and the second sensing electrode 53 is a transparent or translucent structure as well. Similarly, if the light-emitting device 4 is a bottom-emitting structure, the first sensing electrode 51 should be a transparent or translucent structure and the second sensing electrode 53 is a light-reflecting structure. The light-reflecting structure may be formed of one or more metal materials such as Ag, Al or Li, and the transparent or translucent structure is formed of Indium Tin Oxide (ITO) etc. The specific material is not particularly limited here.

Further, as shown in FIGS. 3 and 4, side walls of the sensing hole 31 are contracted along a direction towards the driving backplane 1, that is, the sensing hole 31 is a flared structure expanding in the direction distal to the driving backplane 1, so that the region of the first sensing electrode 51 located within the sensing hole 31 is a flared structure as well, thereby more light reflected from the finger may be received, avoiding an increase in optical signal amount, and reducing information loss, which is conducive to improving the accuracy of fingerprint recognition.

A cross section of the side wall of the sensing hole 31 in a direction perpendicular to the driving backplane 1 is an oblique line intersecting the surface of the first planarization layer 2 distal to the driving backplane 1, an angle α between the oblique line and the surface of the first planarization layer 2 distal to the driving backplane 1 is the slope of the side wall of the sensing hole 31 relative to the surface of the first planarization layer 2 distal to the driving backplane 1, and the size of the slope is not particularly limited here.

When the first sensing electrode 51 is formed, in order to prevent the first sensing electrode 51 from breaking on the side wall of the sensing hole 31 due to the extremely large slope, the above-mentioned slope may not be greater than 50°, that is, α is not greater than 50°, for example, it may be 30°, 45°, etc.

As shown in FIGS. 2 and 4, in some embodiments of the present disclosure, the depth H of the sensing hole 31 may be substantially 1 µm, for example, it may be 0.7 µm, 1 µm, 1.3 µm etc. in the range of 0.7 µm-1.3 µm. Further, the sensing hole 31 penetrates the second planarization layer 3 and exposes the first planarization layer 2, and accordingly, the second planarization layer 3 may have a thickness of substantially 1 µm. Compared with the situation in which the light-emitting devices 4 and the photoelectric sensing devices 5 are disposed on the same plane, the height of the photoelectric sensing device 5 protruding from the second planarization layer 3 may be reduced by 1 µm. Meanwhile, the light-emitting functional layer 42 may have a thickness of 100 nm-200 nm, and the photoelectric conversion layer 52 may have a thickness of 1 µm-2 µm.

In other embodiments of the present disclosure, the thickness of the second planarization layer 3, the depth of the sensing hole 31, the thickness of the light-emitting functional layer 42 and the thickness of the photoelectric conversion layer 52 may be other values, as long as light directly received from the light-emitting functional layer 42 by the photoelectric conversion layer 52 can be reduced or avoided without interfering with the receiving of light reflected from the finger.

The distribution manner of the light-emitting devices 4 and the photoelectric sensing devices 5 of the display panel of the present disclosure will be described below.

As shown in FIG. 2, the driving backplane 1 has a plurality of pixel regions 100 distributed in an array, and a pixel and at least one photoelectric sensing device 5 are provided in the range of at least a part of the pixel region 100, wherein each of the pixels includes three light-emitting devices 4 of different colors. For example, each of the pixel regions 100 is provided with a pixel including three light-emitting devices 4 in red, blue and green, and further includes a photoelectric sensing device 5, thus the number of the photoelectric sensing devices 5 is the same as the number of the pixels, so that fingerprint recognition may be performed in all regions of the display panel. The photoelectric sensing devices 5 may be only provided in part of the pixel regions 100, so that fingerprint recognition is only performed locally.

In order to define the light-emitting devices 4 and the photoelectric sensing devices 5, in some embodiments of the present disclosure, the display panel of the present disclosure may further include a pixel definition layer 6. The pixel definition layer 6 may be provided on the surface of the second planarization layer 3 distal to the driving backplane 1, and has first openings 61 and second openings 62, wherein the first opening 61 exposes the first electrode 41, the light-emitting functional layer 42 of the light-emitting device 4 is located within the first opening 61, the second opening 62 exposes the first sensing electrode 51, and the photoelectric conversion layer 52 of the photoelectric sensing device 5 is located within the second opening 62. If the second sensing electrode 53 and the second electrode 43 are different regions belong to the same electrode layer, the electrode layer may cover the pixel definition layer 6.

Since the photoelectric sensing device 5 is disposed within the sensing hole 31, the height of the photoelectric sensing device 5 protruding from the second planarization layer 3 is decreased, thus reducing the region where light emitted from the light-emitting device 4 can be received directly. Therefore, even if the pixel definition layer 6 is made of a transparent or translucent material, the amount of light directly irradiated onto the photoelectric sensing device 5 without being reflected by the finger can be reduced, and thus the signal-to-noise ratio can still be increased to enhance the accuracy of fingerprint recognition.

Further, a boundary of an orthographic projection of the second opening 62 on the second planarization layer 3 coincides with a boundary of the central portion 511, so that light reflected by the finger can be irradiated onto the central portion 511 and its corresponding photoelectric conversion layer 52.

In addition, the display panel may further include a transparent encapsulation layer 7, and the transparent encapsulation layer 7 may cover the light-emitting devices 4 and the photoelectric sensing devices 5. The encapsulation layer 7 may include two inorganic layers and an organic layer located between the inorganic layers, the encapsulation layer 7 may further include other layers, or the encapsulation layer 7 may be a single-layer structure, and there is no any particular limitation on the specific structure of the encapsulation layer 7 here. The finger may touch the display panel from the side of the encapsulation layer 7 distal to the driving backplane 1 to achieve fingerprint recognition.

Figure 5:
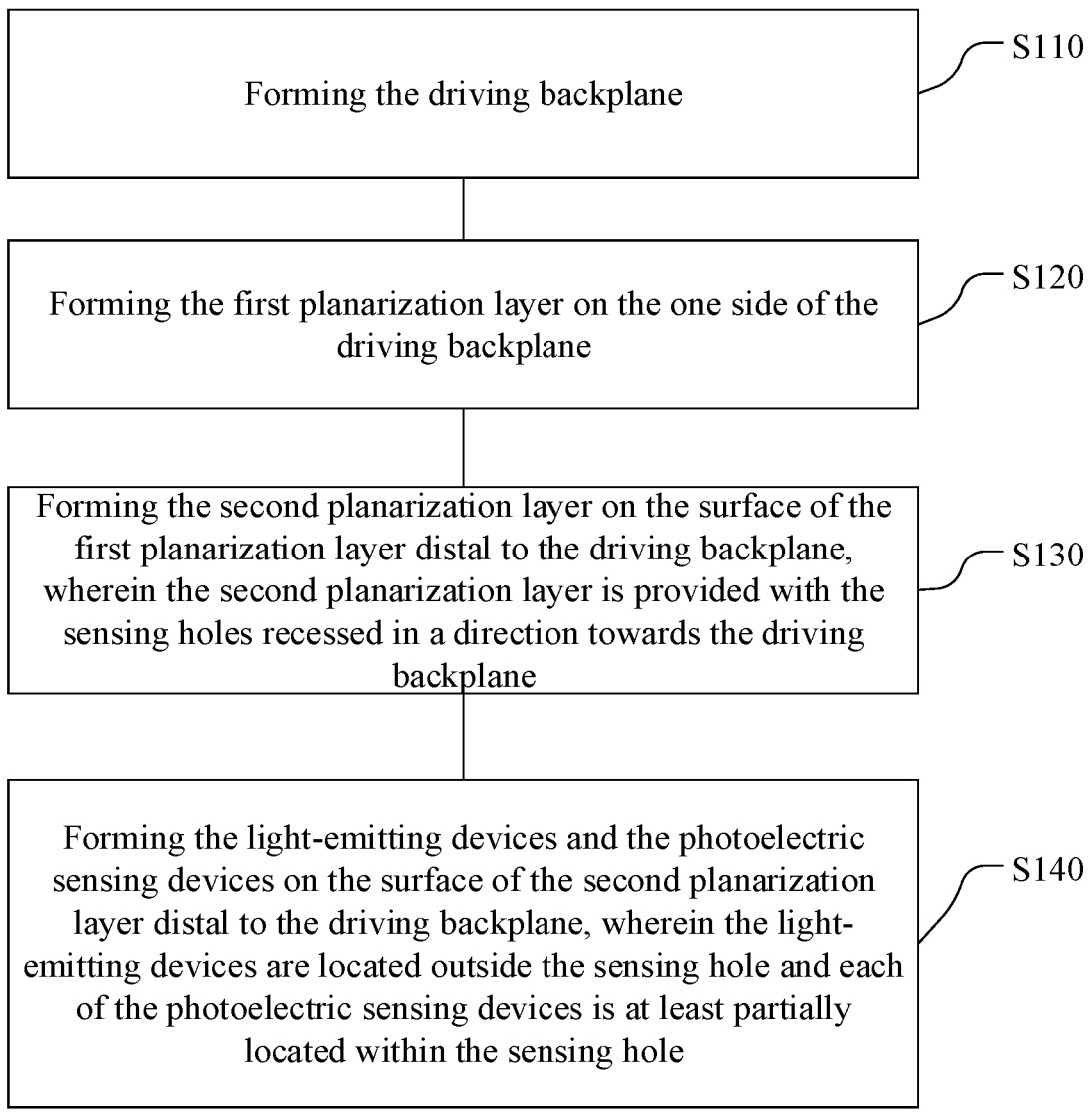
FIG. 5 is a flowchart of an embodiment of a manufacturing method of the present disclosure.

An embodiment of the present disclosure further discloses a method of manufacturing a display panel, which may be a display panel of any of the above-described embodiments, the structure of which will not be elaborated. As shown in FIG. 5, the manufacturing method may include steps S110-S140.

In step S110, the driving backplane is formed.

In step S120, the first planarization layer is formed on the one side of the driving backplane.

In step S130, the second planarization layer is formed on the surface of the first planarization layer distal to the driving backplane, and the second planarization layer is provided with sensing holes recessed in a direction towards the driving backplane.

In step S140, the light-emitting devices and the photoelectric sensing devices are formed on the surface of the second planarization layer distal to the driving backplane, wherein the light-emitting device is located outside the sensing hole, and the photoelectric sensing device is at least partially located within the sensing hole.

In some embodiments of the present disclosure, that the light-emitting devices and the photoelectric sensing devices are formed on the surface of the second planarization layer distal to the driving backplane, i.e., the step S140, includes:

forming the first electrode of the light-emitting device and the first sensing electrode of the photoelectric sensing device on the surface of the second planarization layer distal to the driving backplane by single patterning, wherein the first sensing electrode is recessed into the sensing hole;

forming the light-emitting functional layer of the light-emitting device on the surface of the first electrode distal to the driving backplane;

forming the photoelectric conversion layer of the photoelectric sensing device on the surface of the first sensing electrode distal to the driving backplane, wherein the photoelectric conversion layer is located within the sensing hole; and forming the second electrode of the light-emitting device and the second sensing electrode of the photoelectric sensing device by single patterning, wherein the second electrode is disposed on the surface of the light-emitting functional layer distal to the driving backplane, and the second sensing electrode is disposed on the surface of the photoelectric conversion layer distal to the driving backplane.

The specific structure of the display panel in the manufacturing method of the present disclosure has been described in the above-described embodiments of the display panel and will not be elaborated herein.

It should be noted that although the various steps of the manufacturing method in the present disclosure are described in a particular order in the accompanying drawings, it is not required or implied that the steps must be performed in that particular order or that all of the steps shown must be performed in order to achieve the desired result. Additionally or alternatively, certain steps may be omitted, multiple steps may be combined into a single step for execution, and/or a single step may be decomposed into multiple steps for execution, etc.

Embodiments of the present disclosure also provide a display device, which may include a display panel of any of the above embodiments, the beneficial effect of the display device and the structure of the display panel may be referred to the embodiments of the display panel and will not be described in detail herein. The display device of the present disclosure may be a mobile phone, a tablet computer or other electronic devices having a display function, which will not be enumerated herein.

The display device, the display panel and the method of manufacturing the display panel of the present disclosure can emit light by the light-emitting devices to realize image display; furthermore, light emitted by the light-emitting devices may be reflected by a finger and sensed by the photoelectric sensing devices to realize fingerprint recognition. Since the light-emitting devices are provided on the surface of the second planarization layer distal to the driving backplane and each of the photoelectric sensing devices is at least partially located in the sensing hole, the height of the photoelectric sensing device protruding from the second planarization layer may be reduced or even eliminated, which may reduce or eliminate the height of the photoelectric sensing device over the light-emitting device, so that the photoelectric sensing devices will not be located within the light-emitting range of the light-emitting devices, thus preventing light emitted from the light-emitting devices from being directly irradiated onto the photoelectric sensing devices without being reflecting by the finger, thereby increasing signal-to-noise ratio in the process of fingerprint recognition and improving accuracy of fingerprint recognition.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

What is claimed is:

1. A display panel, comprising:
  a driving backplane;
  a first planarization layer, disposed on one side of the driving backplane;
  a second planarization layer, disposed on a surface of the first planarization layer distal to the driving backplane, wherein the second planarization layer is provided with sensing holes;
  light-emitting devices, disposed on a surface of the second planarization layer distal to the driving backplane, and located outside the sensing holes; and
  photoelectric sensing devices, disposed on the surface of the second planarization layer distal to the driving backplane, wherein each of the photoelectric sensing devices is at least partially located within the sensing hole; wherein
  the light-emitting device comprises:
  a first electrode, disposed on the surface of the second planarization layer distal to the driving backplane;
  a light-emitting functional layer, disposed on a surface of the first electrode distal to the driving backplane; and a second electrode, disposed on a surface of the light-emitting functional layer distal to the driving backplane, and
the photoelectric sensing device comprises:
a first sensing electrode, disposed on the surface of the second planarization layer distal to the driving backplane, and recessed into the sensing hole;
a photoelectric conversion layer, disposed on a surface of the first sensing electrode distal to the driving backplane, and at least partially located within the sensing hole; and
a second sensing electrode, disposed on a surface of the photoelectric conversion layer distal to the driving backplane; and
the display panel further comprises:
a pixel definition layer, disposed on the surface of the second planarization layer distal to the driving backplane and having a first opening and a second opening, wherein the first opening exposes the first electrode, and the second opening exposes the first sensing electrode, wherein
the second electrode and the second sensing electrode are different regions of a same electrode layer, and the electrode layer covers the pixel definition layer, the light-emitting functional layer and the photoelectric conversion layer.

2. The display panel according to claim 1, wherein side walls of the sensing hole are contracted along a direction towards the driving backplane.

3. The display panel according to claim 2, wherein a slope of the side wall of the sensing hole relative to the surface of the first planarization layer distal to the driving backplane is not greater than 50°.

4. The display panel according to claim 1, wherein the first sensing electrode comprises a central portion and an edge portion surrounding the central portion, wherein the central portion is attached to fit within the sensing hole, and the edge portion is located on the surface of the second planarization layer distal to the driving backplane and is connected to the central portion.

5. The display panel according to claim 4, wherein a boundary of an orthographic projection of the second opening on the second planarization layer coincides with a boundary of the central portion.

6. The display panel according to claim 1, wherein the driving backplane has a plurality of pixel regions distributed in an array, and at least three of the light-emitting devices of different colors and at least one of the photoelectric sensing devices are provided within a range of each of the pixel regions.

7. The display panel according to claim 1, wherein the light-emitting functional layer has a thickness of 100 nm-200 nm, the photoelectric conversion layer has a thickness of 1 μm-2 μm, and the sensing hole has a depth of 0.7 μm-1.3 μm.

8. A display device, comprising a display panel, wherein the display panel comprises:
a driving backplane;
a first planarization layer, disposed on one side of the driving backplane;
a second planarization layer, disposed on a surface of the first planarization layer distal to the driving backplane, wherein the second planarization layer is provided with sensing holes;
light-emitting devices, disposed on a surface of the second planarization layer distal to the driving backplane, and located outside the sensing holes; and
photoelectric sensing devices, disposed on the surface of the second planarization layer distal to the driving backplane, wherein each of the photoelectric sensing devices is at least partially located within the sensing hole; wherein
the light-emitting device comprises:
a first electrode, disposed on the surface of the second planarization layer distal to the driving backplane;
a light-emitting functional layer, disposed on a surface of the first electrode distal to the driving backplane; and
a second electrode, disposed on a surface of the light-emitting functional layer distal to the driving backplane, and
the photoelectric sensing device comprises:
a first sensing electrode, disposed on the surface of the second planarization layer distal to the driving backplane, and recessed into the sensing hole;
a photoelectric conversion layer, disposed on a surface of the first sensing electrode distal to the driving backplane, and at least partially located within the sensing hole; and
a second sensing electrode, disposed on a surface of the photoelectric conversion layer distal to the driving backplane; and
the display panel further comprises:
a pixel definition layer, disposed on the surface of the second planarization layer distal to the driving backplane and having a first opening and a second opening, wherein the first opening exposes the first electrode, and the second opening exposes the first sensing electrode, wherein
the second electrode and the second sensing electrode are different regions of a same electrode layer, and the electrode layer covers the pixel definition layer, the light-emitting functional layer and the photoelectric conversion layer.

9. The display device according to claim 8, wherein side walls of the sensing hole are contracted along a direction towards the driving backplane.

10. The display device according to claim 9, wherein a slope of the side wall of the sensing hole relative to the surface of the first planarization layer distal to the driving backplane is not greater than 50°.

11. The display device according to claim 8, wherein the first sensing electrode comprises a central portion and an edge portion surrounding the central portion, wherein the central portion is attached to fit within the sensing hole, and the edge portion is located on the surface of the second planarization layer distal to the driving backplane and is connected to the central portion.

12. The display device according to claim 11, wherein a boundary of an orthographic projection of the second opening on the second planarization layer coincides with a boundary of the central portion.

13. The display device according to claim 8, wherein the driving backplane has a plurality of pixel regions distributed in an array, and at least three of the light-emitting devices of different colors and at least one of the photoelectric sensing devices are provided within a range of each of the pixel regions.

14. The display device according to claim 8, wherein the light-emitting functional layer has a thickness of 100 nm-200 nm, the photoelectric conversion layer has a thickness of 1 μm-2 μm, and the sensing hole has a depth of 0.7 μm-1.3 μm.

* * * * *